(12) United States Patent
Mizunaga et al.

(10) Patent No.: US 8,776,393 B2
(45) Date of Patent: Jul. 15, 2014

(54) SUBSTRATE COOLING APPARATUS, SUBSTRATE COOLING METHOD, AND STORAGE MEDIUM

(75) Inventors: Kouichi Mizunaga, Koshi (JP); Yasuhiro Kuga, Koshi (JP); Masatoshi Kaneda, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 734 days.

(21) Appl. No.: 12/923,690

(22) Filed: Oct. 5, 2010

(65) Prior Publication Data

US 2011/0085299 A1 Apr. 14, 2011

(30) Foreign Application Priority Data

Oct. 13, 2009 (JP) .................. 2009-236447

(51) Int. Cl.
 *F26B 7/00* (2006.01)
 *H05K 7/20* (2006.01)
(52) U.S. Cl.
 USPC .................. 34/428; 361/692; 34/380; 34/391
(58) Field of Classification Search
 USPC ............. 34/428, 493, 497; 165/80.2; 361/692
 See application file for complete search history.

(56) References Cited

U.S. PATENT DOCUMENTS

| 4,116,017 | A | * | 9/1978 | Oberpriller | 62/62 |
| 5,992,046 | A | * | 11/1999 | Weigand et al. | 34/493 |
| 8,142,609 | B2 | * | 3/2012 | Takahashi et al. | 156/345.53 |
| 2002/0130276 | A1 | * | 9/2002 | Sogard | 250/492.2 |

FOREIGN PATENT DOCUMENTS

| JP | 11195599 | A | * | 7/1999 | ............... G03F 7/26 |
| JP | A-11-195599 | | | 7/1999 | |
| JP | A-H11-195599 | | | 7/1999 | |
| JP | 2002141332 | | * | 5/2002 | ......... H01L 21/3065 |
| JP | 2002141332 | A | * | 5/2002 | ........... H01L 21/302 |
| JP | A-2002-141332 | | | 5/2002 | |
| JP | A-07-153749 | | | 10/2002 | |
| JP | A-2003-289093 | | | 10/2003 | |

OTHER PUBLICATIONS

Office Action mailed Dec. 20, 2011 in corresponding JP application No. 2009-236447 (and English translation).

* cited by examiner

*Primary Examiner* — Len Tran
*Assistant Examiner* — Tiffany Johnson
(74) *Attorney, Agent, or Firm* — Posz Law Group, PLC (57) ABSTRACT

A substrate cooling apparatus is configured to include: a mounting table including a mounting surface for mounting a substrate thereon; a projection provided on the mounting surface for supporting a rear surface of the substrate; a coolant flow path through which a coolant flows, provided in the mounting table for cooling the mounting surface; a plurality of gas discharge ports provided in a circumferential direction at a peripheral edge portion of the mounting surface for discharging a cooling gas for cooling the substrate; a gas suction port provided at a center portion of the mounting surface for sucking the cooling gas; and a groove provided in the mounting surface for diffusing the cooling gas in a circumferential direction of the substrate. The substrate cooling apparatus configured as described above can cool the substrate mounted on the mounting surface with high uniformity.

8 Claims, 11 Drawing Sheets

SUBSTRATE COOLING APPARATUS, SUBSTRATE COOLING METHOD, AND STORAGE MEDIUM

BACKGROUND OF THE INVENTION

1. Field of the Invention

The present invention relates to a substrate cooling apparatus, a substrate cooling method, and a storage medium.

2. Description of the Related Art

In a coating and developing apparatus for forming a resist pattern, a wafer cooling apparatus called a cooling plate for cooling a semiconductor wafer (hereafter, referred to as a wafer) which has been subjected to heat-processing is provided. This wafer cooling apparatus cools (temperature-regulates) the wafer before a coating film such as a resist is formed, to set the wafer to a predetermined temperature. The coating film forming processing is performed after the cooling, whereby the film can be formed with high uniformity for each wafer. Further, the wafer is cooled by the wafer cooling apparatus also before the developing treatment, whereby the uniformity of the line width of the pattern can be improved.

The wafer cooling apparatus includes a mounting table for mounting the wafer thereon, and the mounting table surface is temperature-controlled by a so-called chiller. Describing in more detail, circulation paths through which cooling water temperature-controlled by a common chiller flows are provided in mounting tables, and the cooling water cools the mounting table surfaces. This can cool the wafer mounted on the mounting table.

Incidentally, to improve the throughput of the coating and developing apparatus, the improvement in the cooling speed of the wafer cooling apparatus is being studied. However, to cool the wafer mounted on each of the mounting tables to a cooling target cooling target temperature, for example, 23° C., the cooling water needs to be controlled at a temperature corresponding to the target temperature. In other words, the cooling temperature of the cooling water is limited by the cooling target temperature. Accordingly, in the case where a plurality of wafer cooling apparatuses are provided in the coating and developing apparatus, even if the temperatures of the wafers mounted on the mounting tables are different from each other, the cooling water at the same temperature has to be supplied to them, so that it may be difficult to rapidly cool the wafers in some cases. Further, it is also conceivable to provide a plurality of chillers to be able to control the temperature of the cooling water independently for each of the wafer cooling apparatuses, and individually control the temperature of the cooling water to thereby improve the throughput, which leads to increased cost.

For the above reason, cooling of the wafer by supplying a cooling gas to a space between the mounting table and the rear surface of the wafer mounted there on as well as performing the cooling by the cooling water is discussed, and a substrate cooling apparatus thus configured is disclosed in, for example, Japanese Patent Application Laid-open No. H11-195599 (paragraph 0093, FIG. 19 and FIG. 22). However, a problem when cooling is performed using the cooling gas is that it is difficult to cool the wafer with high uniformity by controlling the flow of the gas. If a resist or a chemical for forming various kinds of films is supplied in the state where the temperature is nonuniform within the wafer because of insufficient control of the cooling gas, the film thickness may become nonuniform within the wafer. Further, when a developing solution is supplied in this state, the line width of the resist pattern may differ within the wafer.

For example, in Japanese Patent Application Laid-open No. H11-195599, the unevenness of the gas flow on the lower surface of the substrate can be prevented by forming a projection on the mounting table in a line shape along the circumferential direction of the substrate. However, when such a projection is provided, the projection actually blocks the gas flow to make it difficult for the cooling gas to spread to the inside of the projection, so that the cooling with high uniformity may be difficult. Further, in Japanese Patent Application Laid-open No. H07-153749 (paragraph 0033 and FIG. 5), the method of supplying a cooling gas at a temperature lower than the target temperature to the substrate and then bringing the cooling gas to the target temperature to thereby rapidly cool the substrate is described, but the means for cooling the substrate with high uniformity is not described.

SUMMARY OF THE INVENTION

The present invention is made in view of the above circumstances, and it is an object thereof to provide a substrate cooling apparatus, a substrate cooling method and a storage medium including a computer program implementing the cooling method, each capable of cooling a substrate with high uniformity.

A substrate cooling apparatus of the present invention, includes:

a mounting table including a mounting surface for mounting a substrate thereon;

a projection provided on the mounting surface for supporting a rear surface of the substrate;

a coolant flow path through which a coolant flows, provided in the mounting table for cooling the mounting surface;

a plurality of gas discharge ports provided in a circumferential direction at a peripheral edge portion of the mounting surface for discharging a cooling gas for cooling the substrate;

a gas suction port provided at a center portion of the mounting surface for sucking the cooling gas; and a groove provided in the mounting surface for diffusing the cooling gas in a circumferential direction of the substrate.

A substrate cooling method of the present invention, includes the steps of:

mounting a substrate on a mounting surface of a mounting table;

supporting the substrate on a projection provided on the mounting surface;

passing a coolant through a coolant path provided in the mounting table to cool the mounting surface;

discharging a cooling gas for cooling the substrate from a plurality of gas discharge ports provided in a circumferential direction at a peripheral edge portion of the mounting surface;

sucking the cooling gas through a gas suction port provided at a center portion of the mounting surface; and diffusing the cooling gas in a circumferential direction of the substrate by a groove provided in the mounting surface.

A storage medium of the present invention is a storage medium storing a computer program used in a substrate cooling apparatus, wherein the computer program is for implementing a substrate cooling method, the substrate cooling method including the steps of: mounting a substrate on a mounting surface of a mounting table; supporting the substrate on a projection provided on the mounting surface; passing a coolant through a coolant path provided in the mounting table to cool the mounting surface; discharging a cooling gas for cooling the substrate from a plurality of gas discharge ports provided in a circumferential direction at a peripheral edge portion of the mounting surface; sucking the cooling gas through a gas suction port provided at a center portion of the mounting surface; and diffusing the cooling gas in a circumferential direction of the substrate by a groove provided in the mounting surface.

According to the present invention, the substrate cooling apparatus includes a coolant flow path for cooling a mounting surface for a substrate, a plurality of gas discharge ports provided in a circumferential direction at a peripheral edge portion of the mounting surface, a gas suction port provided at a center portion of the mounting surface, and a groove provided in the mounting surface for diffusing the cooling gas in a circumferential direction of the substrate. With such configuration, the substrate can be cooled with high uniformity.

DETAILED DESCRIPTION OF THE INVENTION (First Embodiment)

Figure 1:
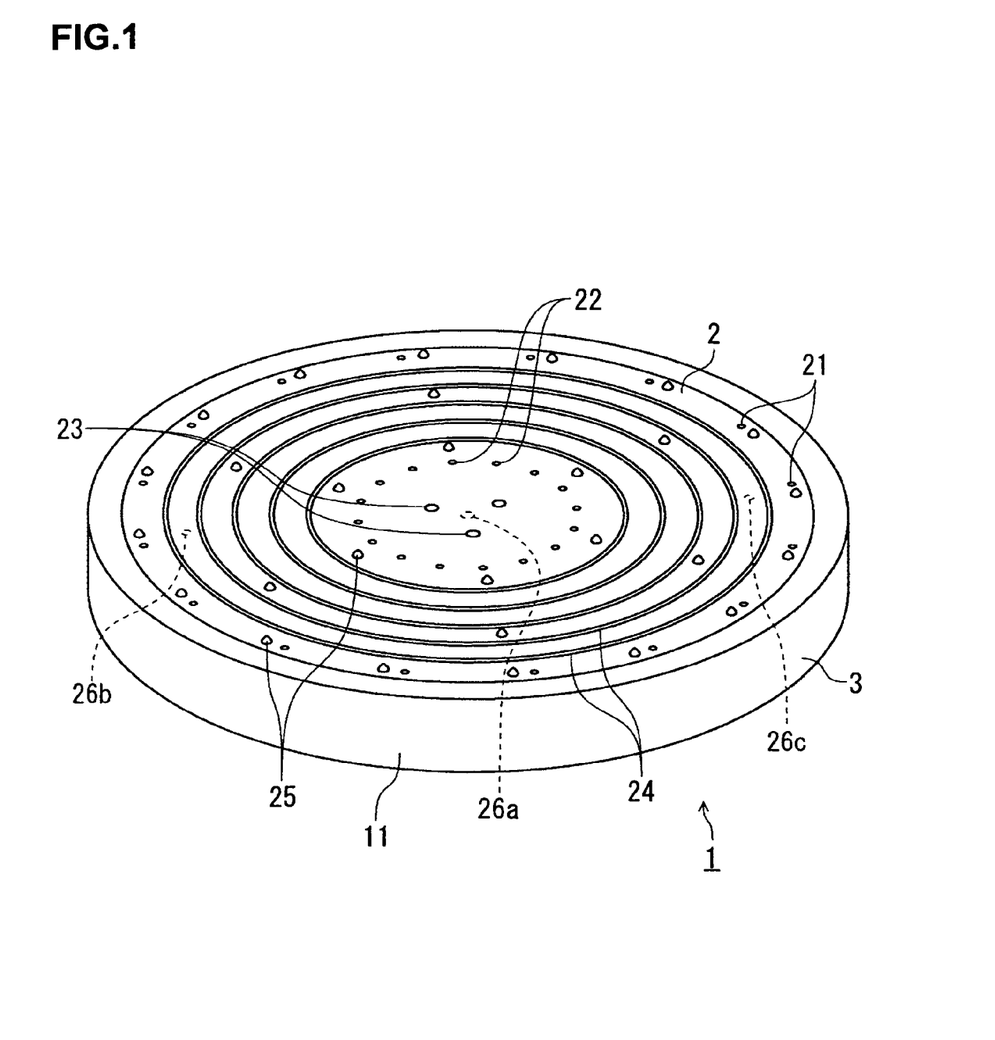
FIG. 1 is a perspective view of a wafer cooling apparatus according to present invention.
Figure 2:
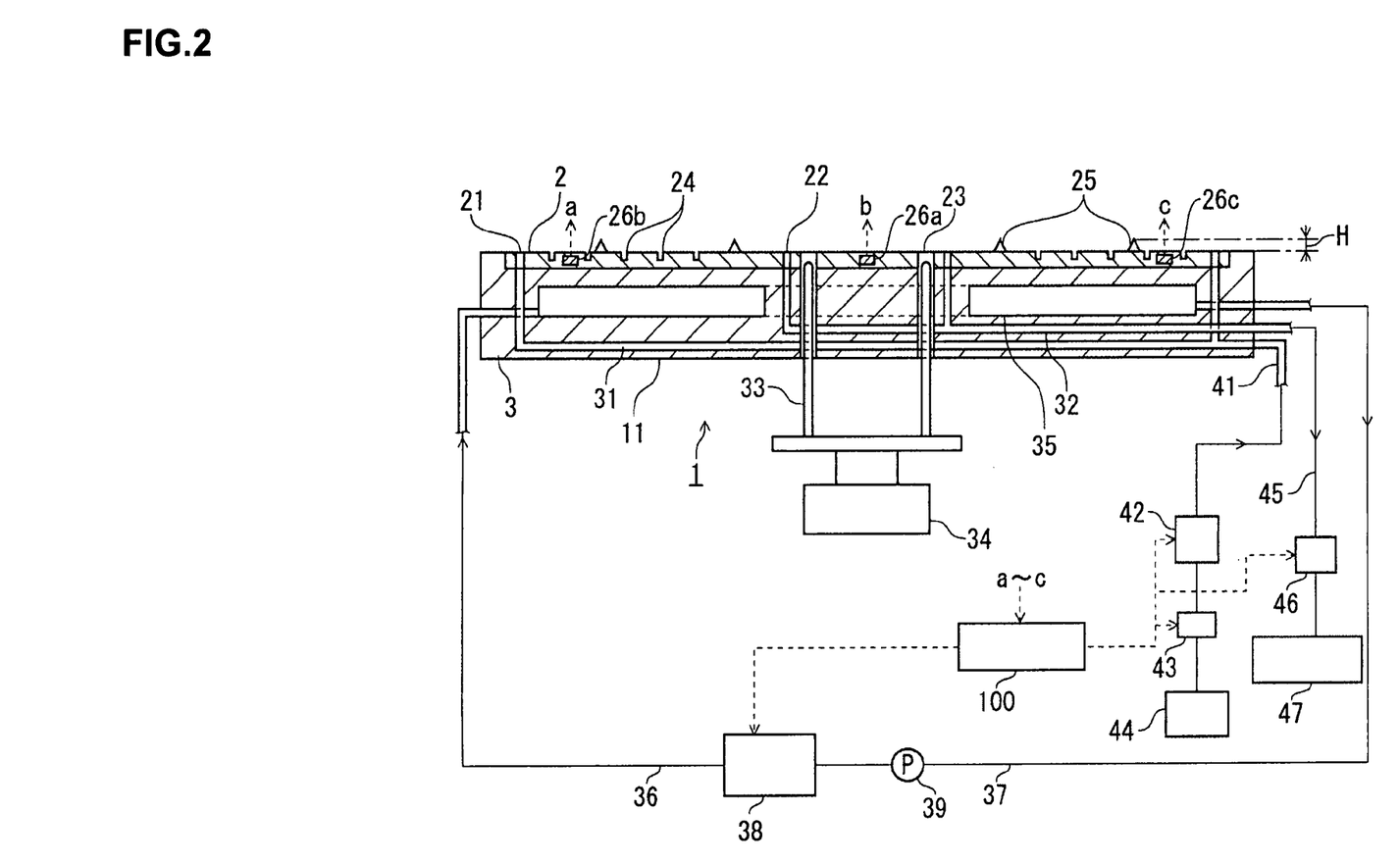
FIG. 2 is a longitudinal side view of the wafer cooling apparatus.

A wafer cooling apparatus 1 according to a substrate cooling apparatus of the present invention will be described with reference to FIG. 1 and FIG. 2 which are a perspective view and a longitudinal side view thereof. The wafer cooling apparatus 1 is an apparatus for cooling the wafer W being a substrate, and includes a mounting table 11 in a flat circular shape. The mounting table 11 has a disk 2 constituting the surface of the mounting table 11 and a support unit 3 for supporting the disk 2. The waver W is transferred by a not-shown transfer mechanism to the cooling apparatus 1.

Many air discharge ports 21 are formed at the peripheral portion of the disk 2 at intervals along the circumferential direction of the disk 2. Further, many air suction ports 22 are formed at the center potion of the disk 2 at intervals along the circumferential direction of the disk 2. These air discharge ports 21 and air suction ports 22 open in the vertical direction. Further, three holes 23 open to be surrounded by the air suction ports 22. Through these holes 23, later-described raising and lowering pins 33 move up and down.

Between the air discharge ports 21 and the air suction ports 22 in the front surface of the disk 2, a plurality of ring-shaped grooves 24 different in size from each other are formed. The grooves 24 are concentrically arranged around the center of the disk 2, and have a function of diffusing, toward the circumferential direction of the wafer W, a cooling air (cooling gas) flowing from the air discharge ports 21 to the air suction ports 22 as will be described later. The width of each groove 24 is, for example 1 mm to 2 mm, and the depth of each groove 24 is, for example, 0.2 mm to 1 mm.

Further, many support pins 25 are dispersedly arranged on the front surface of the disk 2. The support pins 25 support the rear surface of the wafer W, and the wafer W supported on the support pins 25 is cooled by the disk 2, which is cooled by the cooling water, and the cooling air flowing on the rear surface of the wafer W as will be described later. To efficiently cool the wafer W, the height of the support pin 25 is set to, for example, 40 μm to 10 μm indicated by H in FIG. 2.

Further, three temperature sensors 26a, 26b, 26c are embedded in the disk 2 along its radial direction. The temperature sensor 26a detects the surface temperature at the center portion of the disk 2, and the temperature sensors 26b, 26c detect the surface temperatures at the peripheral portions of the disk 2. These temperature sensors 26a to 26c transmit output signals to a later-described control unit 100 according to the detected temperatures. In this example, since the wafer W is brought close to the disk 2 when the wafer W is mounted on the mounting table 11, the surface temperatures of the disk 2 are regarded to be almost the same as the temperatures of the wafer W. Then, based on the detection results of the temperature sensors 26a to 26c, supply of the cooling air is controlled, whereby the temperatures of the wafer W are managed.

The support unit 3 will be described next. The support unit 3 is provided with an air supply path 31 whose downstream side is connected to the air discharge ports 21, and the upstream side of the air supply path 31 is connected with one end of an air supply pipe 41. The other end of the air supply pipe 41 is connected to a supply source 44 in which air is stored via an air cooling unit 42 and a flow rate control unit 43 in this order. The flow rate control unit 43 is composed of a valve, a mass flow controller and so on, and receives a control signal outputted from the later-described control unit 100 and controls supply and stop of air to the air discharge ports 21.

The air cooling unit 42 includes a flow path through which a coolant flows and a flow path for air provided along the air supply pipe 41. In the air cooling unit 42, the flow rate of the coolant is controlled according to the control signal outputted from the control unit 100, whereby the heat quantity to be exchanged between the air and the coolant flowing through the paths is controlled. By the heat exchange between the air and the coolant, the air supplied to the gas supply unit 42 is cooled to a predetermined temperature and then supplied to the rear surface of the wafer W.

Further, an air suction path 32 whose upstream side is connected to the air suction ports 22, and the downstream side of the air suction path 32 is connected with one end of an air suction pipe 45. The other end of the air suction pipe 45 is connected to an exhauster 47 composed of a vacuum pump and the like via an exhaust rate regulating unit 46. The exhaust rate regulating unit 46 is composed of a valve, a mass flow controller and so on, and receives a control signal outputted from the control unit 100 and regulates the exhaust rate from the air suction ports 22.

The support unit 3 includes the raising and lowering pins 33 for delivering the waver W between the not-shown transfer unit and the mounting table 11 and a drive mechanism 34 for raising and lowering the raising and lowering pins 33. The raising and lowering pins 33 can project or retract from the disk 2 via the holes 23.

Further, in the support unit 3, a cooling water flow path 35 is formed in a ring shape, for example, along the circumferential direction of the support unit 3 in a manner not to interfere with the air supply path 31, the air suction path 32 and the raising and lowering pins 33. One end of each of a cooling water supply pipe 36 and a cooling water collecting pipe 37 is connected to the flow path 35, and the other end of each of the cooling water supply pipe 36 and the cooling water collecting pipe 37 is connected to a water cooling unit 38. The flow path 35, the cooling water supply pipe 36 and the cooling water collecting pipe 37 constitute a circulation path for the cooling water. A pump 39 for circulating the cooling water through the circulation path is further provided at the cooling water collecting pipe 37.

The water cooling unit 38 includes a flow path through which the coolant circulates and a flow path for the cooling water connected to the cooling water supply pipe 36 and the cooling water collecting pipe 37. The flow rate of the coolant is controlled according to a control signal outputted from the control unit 100, whereby the heat quantity to be exchanged between the cooling water and the coolant flowing through the flow paths is controlled. The water in the cooling water collecting pipe 37 is supplied to the water cooling unit 38 by the pump 39, regulated to a set temperature in the water cooling unit 38, and supplied to the cooling water flow path 35 in the support unit 3 via the cooling water supply pipe 36.

In the wafer cooling apparatus 1, the control unit 100 composed of, for example, a computer is provided. The control unit 100 includes a data processing unit composed of a program, a memory, and a CPU. In the program, commands (steps) are installed to cause the control unit 100 to send control signals to the units in the wafer cooling apparatus 1 so as to proceed the above-described processing processes. Besides, the memory has a region into which values of processing parameters such as the temperature of the cooling water, the supply flow rate of the cooling air, and the power value will be written. When the CPU executes each command of the program, the processing parameters are read, and control signals according to the parameter values are sent to the units in the wafer cooling apparatus 1. The program (also including programs relating to the input operation and display of the processing parameters) is stored in a storage medium such as a flexible disk (FD), a compact disk (CD), a hard disk (HD), an MO (magneto-optical disk), or a memory card, and installed into the control unit 100.

Figure 3A:
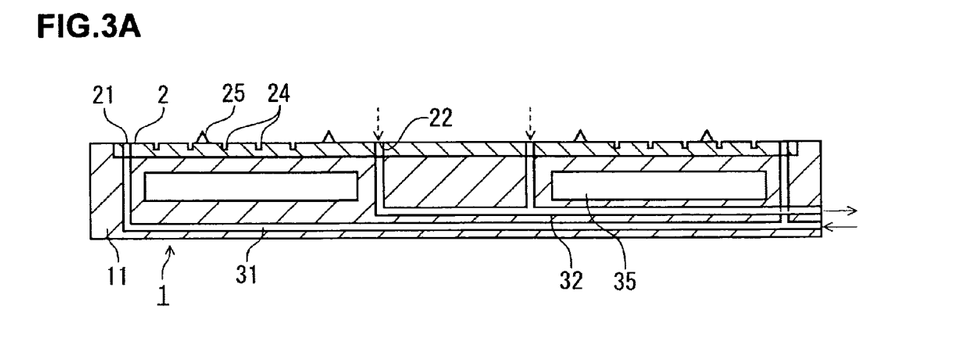
FIG. 3A is a process chart of cooling the wafer by the wafer cooling apparatus.

Subsequently, the appearance that the wafer W is cooled in the wafer cooling apparatus 1 will be described with reference to the side views of the mounting table 11 in FIG. 3A to FIG. 3C and the time chart showing the temperature change of the wafer W and the supply and stop of the cooling air in FIG. 4. As has been described, the temperatures at portions of the wafer W correspond to the temperatures of portions of the disk 2 measured by the temperature sensors 26a to 26c. Note that, in FIG. 4, the solid line indicates the temperature change of the wafer W by the wafer cooling apparatus 1, whereas the chain line indicates the temperature change of the wafer W cooled by the conventional wafer cooling apparatus for comparison. The conventional wafer cooling apparatus here is an apparatus which cools the wafer W only by the cooling water flowing through the mounting table 11 without using the cooling air.

The wafer W transferred to the wafer cooling apparatus 1 has been heated to about 150° C., for example, in a wafer heating apparatus provided at a stage proceeding to the wafer cooling apparatus 1. In the wafer cooling apparatus 1, the cooling water which has been temperature-controlled to 23° C. in advance by the water cooling unit 38 is supplied to the cooling water flow path 35 in the mounting table 11 via the cooling water supply pipe 36 in order to be able to cool the wafer W to 23° C. that is the cooling target temperature. The cooling water supplied to the cooling water flow path 35 is collected to the water cooling unit 38 via the cooling water collecting pipe 37 and temperature-controlled to 23° C., and then repeatedly supplied to the cooling water flow path 35. The circulation of the cooling water keeps the surface temperature of the mounting table 11 at 23° C. Further, exhaustion is performed in advance via the air suction ports 22 (FIG. 3A). Besides, the temperature sensors 26a to 26c detect the temperatures at portions around the temperature sensors 26 in the disk 2, and output signals corresponding to the detected values to the control unit 100.

After the wafer W is mounted on the mounting table 11 by the not-shown wafer transfer unit, the raising and lowering pins 33 are raised, and then lowered after supporting the rear surface of the wafer W. Then, the wafer W is delivered onto the support pins 25, and the surface temperature of the mounting table 11 increases due to the heat of the wafer W. Immediately after the wafer W is delivered to the mounting table 11, air is supplied to the air supply pipe 41 (time t0 in FIG. 4).

The control unit 100 starts judgment whether or not all of the detected temperatures by the three temperature sensors 26a to 26c are not higher than 23° C. Then, the circulation of the cooling water cools the surface of the mounting table 11 to cause heat exchange between the surface of the mounting table 11 and the wafer W, so that the temperature of the surface of the wafer W decreases.

Figure 3B:
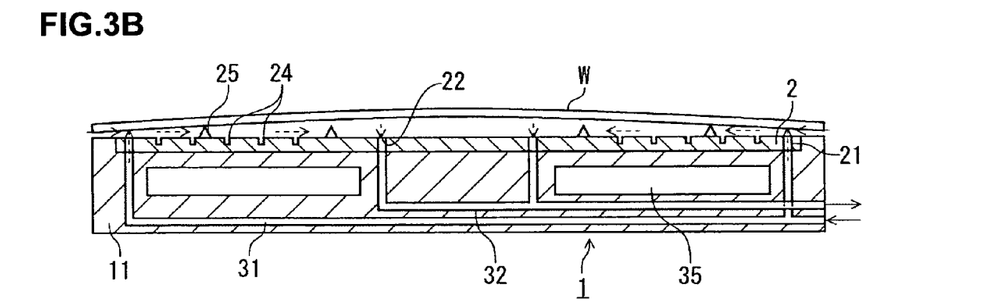
FIG. 3B is a process chart of cooling the wafer by the wafer cooling apparatus.
Figure 3C:
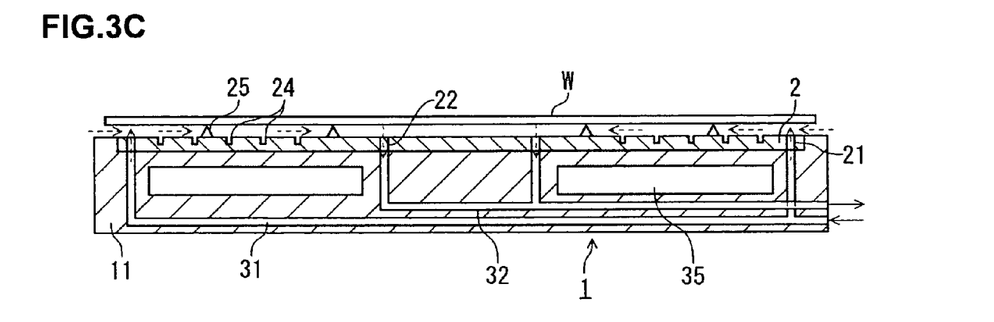
FIG. 3C is a process chart of cooling the wafer by the wafer cooling apparatus.
Figure 5:
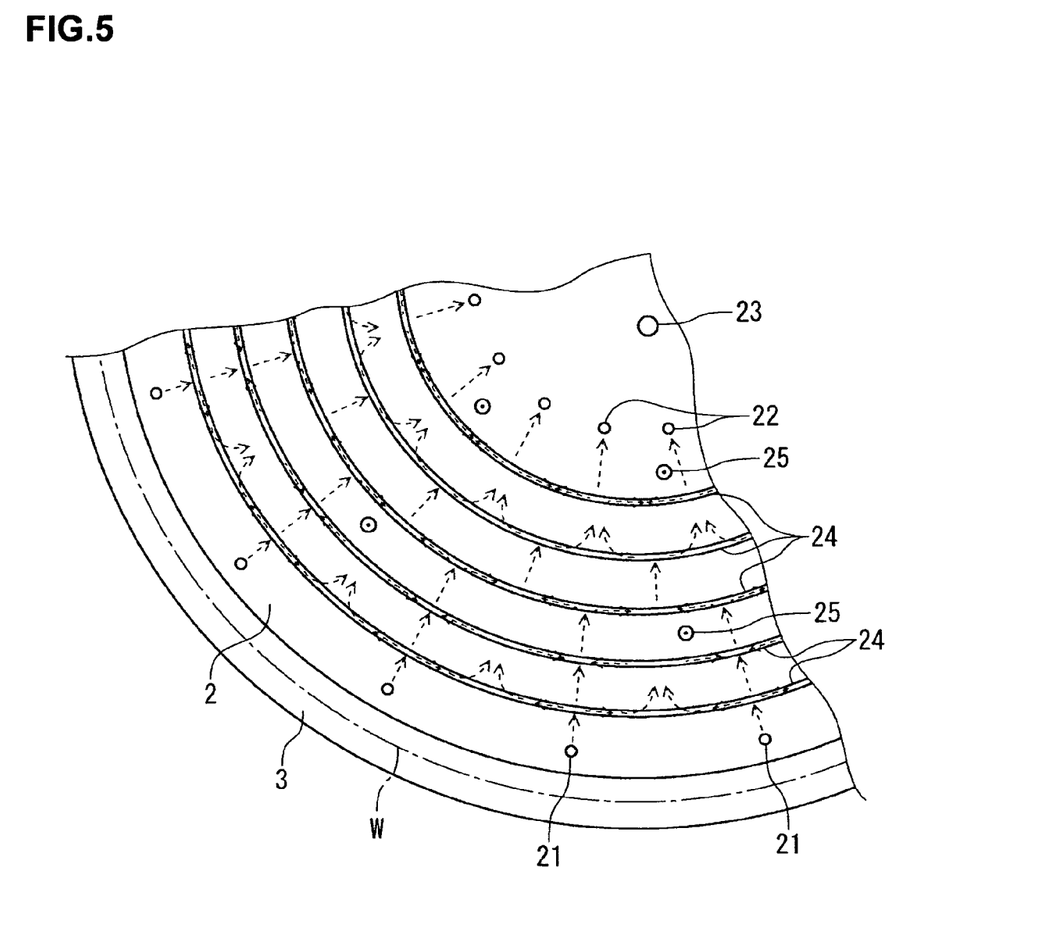
FIG. 5 is an explanatory view showing the cooling air on a mounting table surface in the wafer cooling apparatus.

The air supplied to the air supply pipe 41 is cooled in the air cooling unit 42 to 20° C. lower than the cooling target temperature of the wafer W (23° C.), and discharged from the air discharge ports 21 of the disk 2 to the rear surface of the wafer W (FIG. 3B). To prevent the wafer W from floating up from the mounting table 11, the total supply flow rate of air discharged from the air discharge ports 21 is controlled to be lower than the total flow rate of air sucked through the air suction ports 22. As shown by arrows in FIG. 5, the cooling air discharged from the air discharge ports 21 is sucked into the air suction ports 22 together with the air surrounding the wafer cooling apparatus 1, and flows toward from the peripheral edge portion to the center portion side of the surface of the disk 2 and into the grooves 24. Then, the cooling air further proceeds to the center portion on the disk 2 while being guided in the circumferential direction of the disk 2 along the grooves 24, and flows into the air suction ports 22 to be exhausted.

The mounting table 11 surface and the wafer W are rapidly cooled by being exposed to the cooling air formed between mounting table 11 surface and the rear surface of the wafer W. Further, if the wafer W warps such that the center portion is higher than the peripheral portion when the wafer W is transferred into the wafer cooling apparatus 1 as shown in FIG. 3B, the suction of the center portion of the wafer W resolves the warpage as shown in FIG. 3C.

Figure 4:
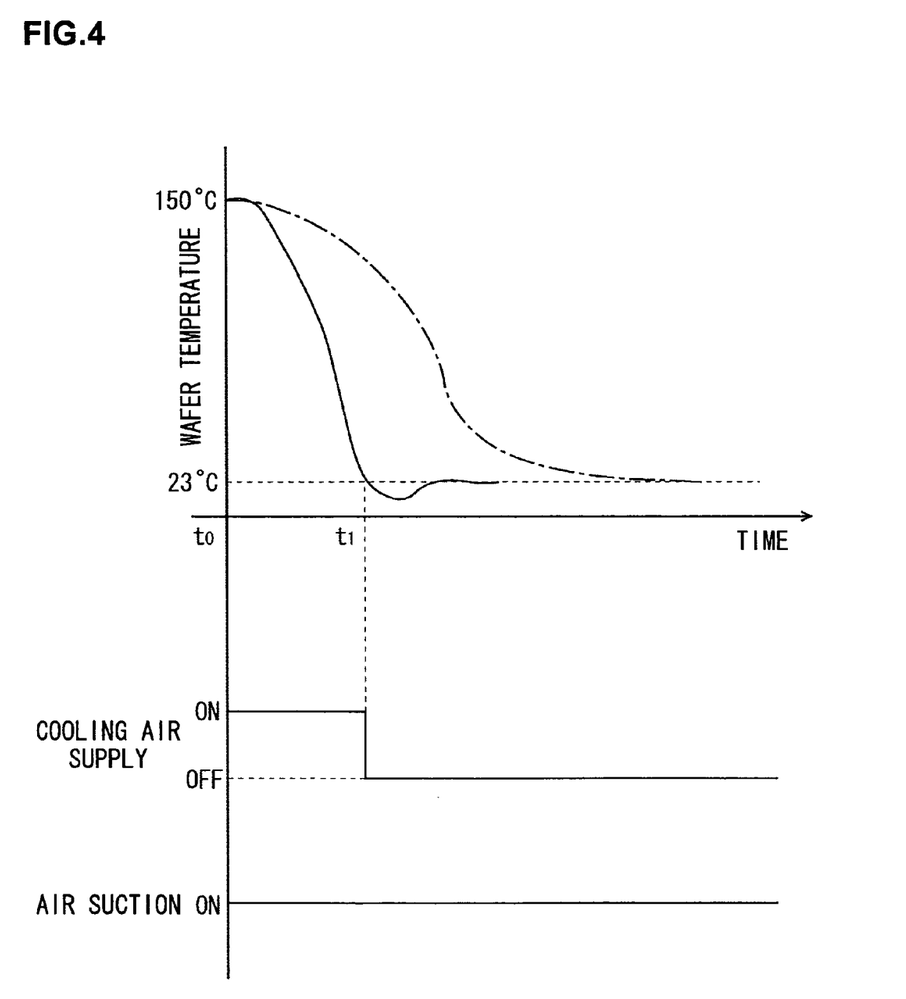
FIG. 4 is a graph showing the temperature change of the wafer and the timing to supply a cooling air.

When the cooling of the wafer W is continued and the detected temperatures by the three temperature sensors 26a to 26c are lowered to be 23° C. or lower, the control unit 100 transmits a control signal to the flow rate control unit 43 to stop the supply of air from the air supply source 44 (time t1 in FIG. 4). Even after the stop of the supply of cooling air, the temperature of the wafer W continues to lower for a short time due to the cooling air remaining between the wafer W and the disk 2. Thereafter, the temperature of the wafer W surface increases and is kept at 23° C. because the temperature of the cooling water is at 23° C. In other words, as shown in FIG. 4, the graph of the temperature change of the wafer W indicates so-called overshoot in which the temperature once lowers to below 23° C. and becomes stable at 23° C. After the cooling is performed as described above, the raising and lowering pins 33 lift up the cooled wafer W, and the wafer W is delivered to the not-shown transfer unit and transferred out of the wafer cooling apparatus 1.

In the wafer cooling apparatus 1, the cooling air flowing from the air discharge ports 21 to the air suction ports 22 is diffused in the circumferential direction of the wafer W by the grooves 24 on the surface of the mounting table 11. As a result, variations in temperature within the wafer W can be prevented when the wafer W is cooled. Further, in the wafer cooling apparatus 1, the cooling air and the mounting table 11 which is cooled by the cooling water cool the wafer W, so that the cooling time of the wafer W can be made shorter as compared to the case where only the mounting table 11 cools the wafer W. Further, since the cooling air at a temperature lower than the cooling target temperature of the wafer W is supplied to the wafer W, especially the temperature fall performance immediately after the start of cooling the wafer can be improved in the wafer cooling apparatus 1. Thus, the cooling time per wafer W can be shortened as shown in FIG. 4, so that the throughput can be improved.

The cooling air flows through the small space between the rear surface of the wafer supported on the support unit 3 and the mounting table 11 surface and therefore spreads within the wafer W with higher uniformity as compared to the case where the cooling air is supplied by a nozzle from above the wafer W. Therefore, the cooling air can cool the wafer W with high uniformity. Further, a plurality of air suction ports 22 are dispersedly provided in the wafer cooling apparatus 1. If the air suction port 22 is provided only one location, the pressure around the air suction port 22 excessively lowers so that the wafer W is pressed against the mounting table 11 and thereby comes into friction with the support pins 25 to possibly cause particles. Accordingly, it is preferable to dispersedly provide the plurality of air suction ports 22 as described above.

Further, a plurality of air discharge ports 21 are provided along the peripheral edge portion of the disk 2, while the air suction ports 22 are provided at the center portion of the disk 2 in the above example. However, conversely the air suction ports 22 may be provided along the peripheral edge portion of the disk 2, while the air discharge ports 21 may be provided at the center portion of the disk 2. It should be noted that the air discharge ports 21 provided along the peripheral edge portion and the air suction ports 22 provided at the center portion of the disk 2 can further suppress the suction rate of the air around the wafer cooling apparatus 1. This configuration exerts less influence on the airflow around the cooling apparatus 1 when the wafer cooling apparatus 1 is installed in a treatment apparatus such as the coating and developing apparatus. As a result, the influence of the cooling apparatus 1 exerted on the treatment in the treatment apparatus is suppressed, so that the configuration is advantageous.

Figure 6:
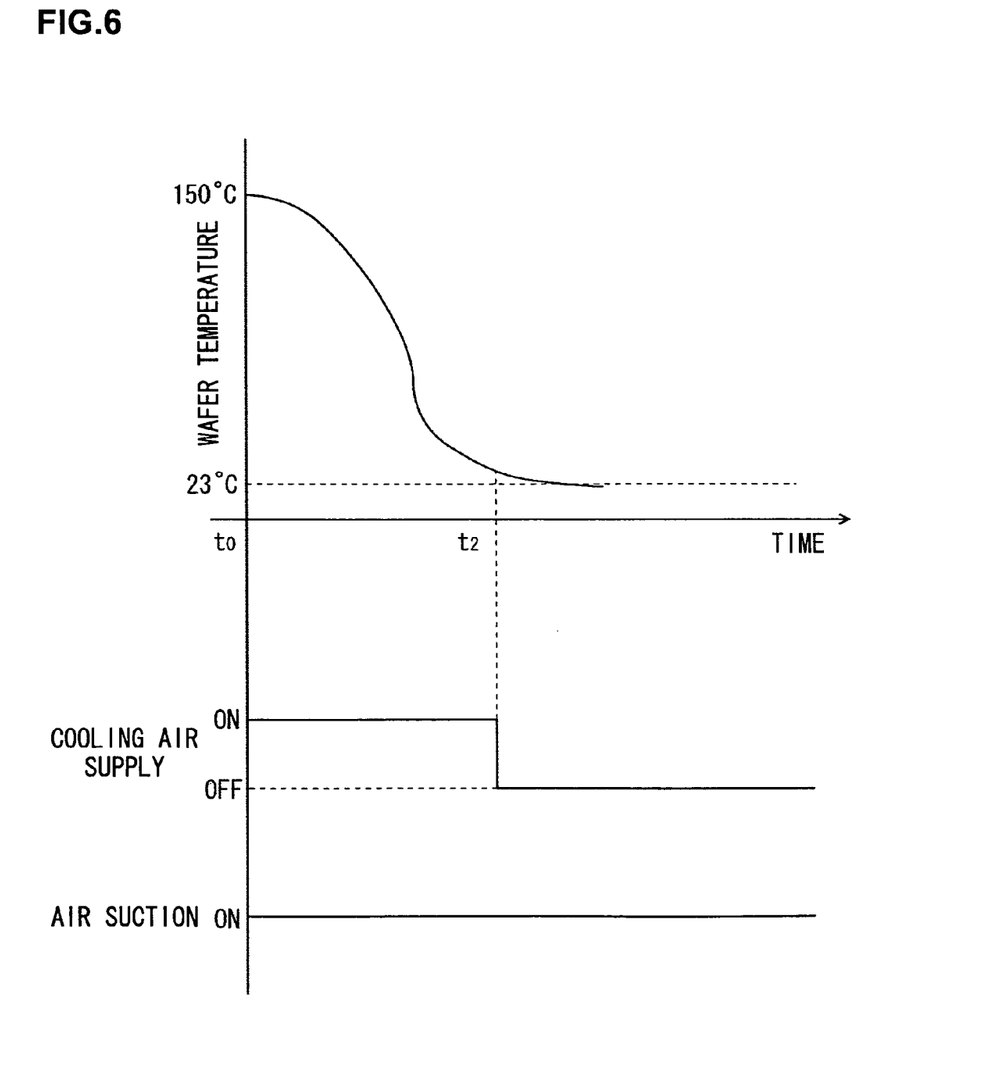
FIG. 6 is a graph showing another timing to supply the gas.

Besides, the temperature of the cooling air and the timing to supply the cooling air are not limited to those in the above-described example, but, for example, the temperature of the cooling air may be set to 23° C. to be same as the cooling water, and the supply of the cooling air may be stopped at time t2 when the temperature of the wafer W is close to the target temperature 23° C. as shown in FIG. 6. Alternatively, the temperature sensors 26a to 26c are not provided, but a time period from the start of supply of the cooling air to the time when the temperature of the wafer W reaches a desired temperature may be obtained in advance by experiment and the air may be supplied only for the time period.

Further, the grooves 24 formed in the disk 2 only need to guide the cooling air in the circumferential direction of the wafer W, and therefore the shape and the number of the grooves 24 are not limited to those in the above example. FIG. 7A, FIG. 7B and FIG. 8A to FIG. 8C show other configuration examples of the disk 2. In FIG. 7A, FIG. 7B and FIG. 8A to FIG. 8C, the air suction ports 22 are shown filled in black to be distinguished from the air discharge ports 21, and the support pins 25 are omitted. In each example, the locations to arrange the support pins 25 are arbitrarily set.

Figure 7A:
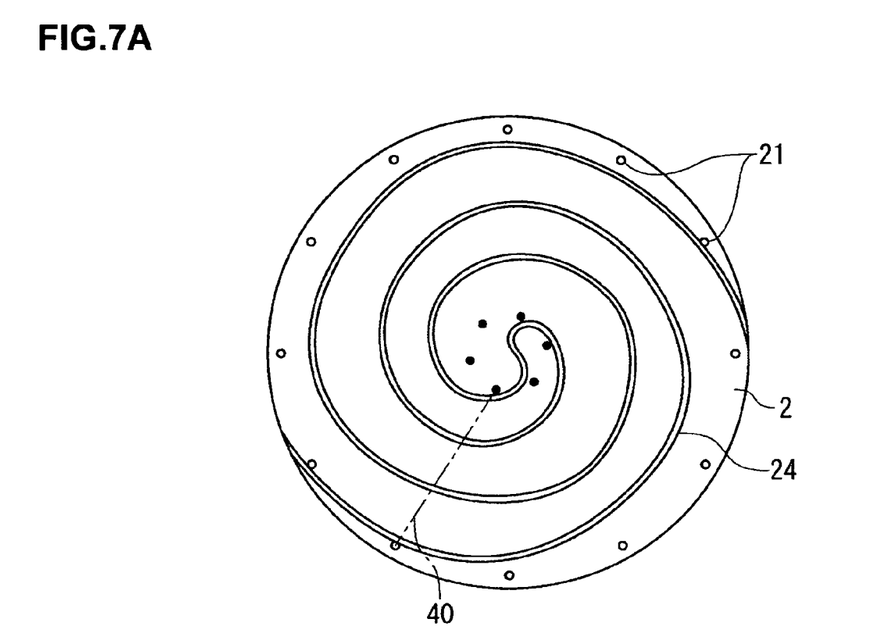
FIG. 7A is an explanatory view showing another example of a groove formed in the mounting table surface.
Figure 7B:
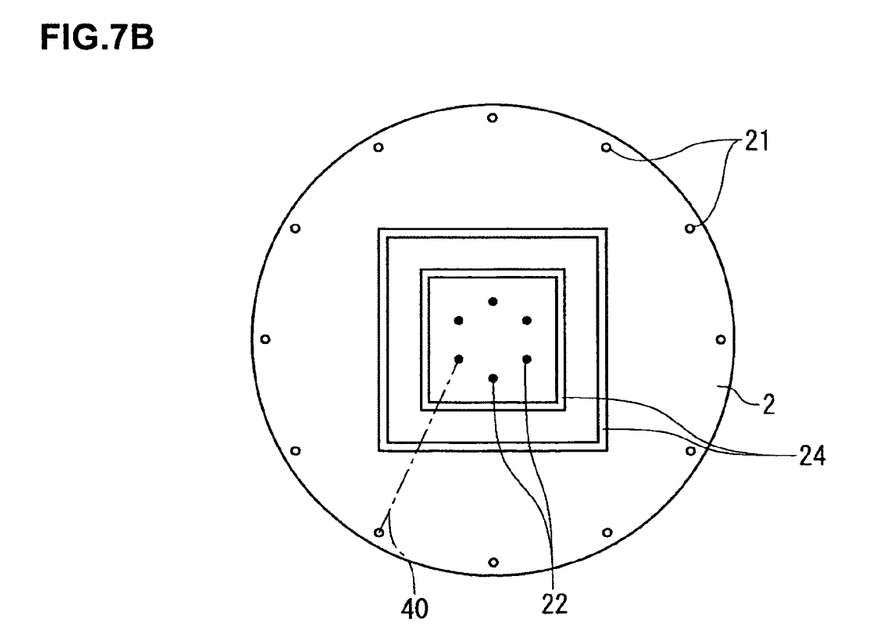
FIG. 7B is an explanatory view showing another example of grooves formed in the mounting table surface.
Figure 8A:
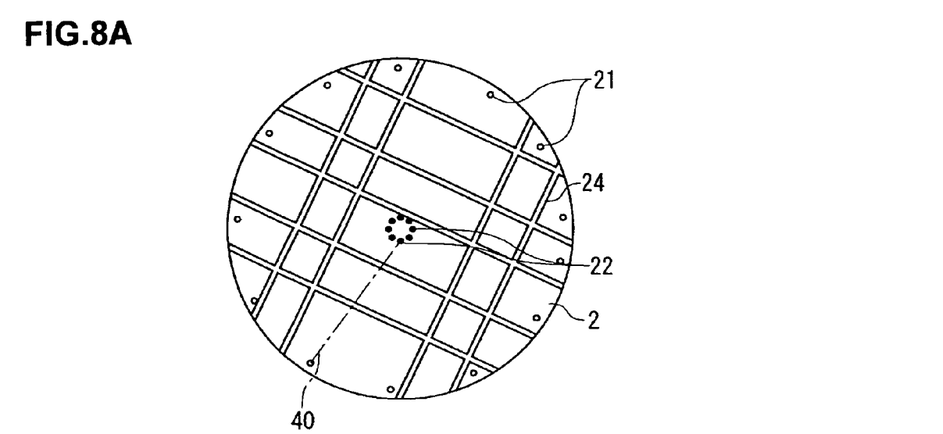
FIG. 8A is an explanatory view showing another example of grooves formed in the mounting table surface.
Figure 8B:
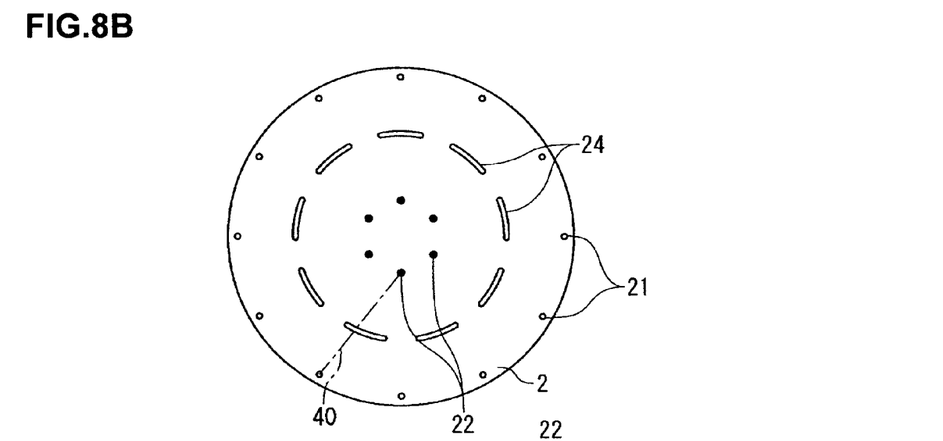
FIG. 8B is an explanatory view showing another example of grooves formed in the mounting table surface.
Figure 8C:
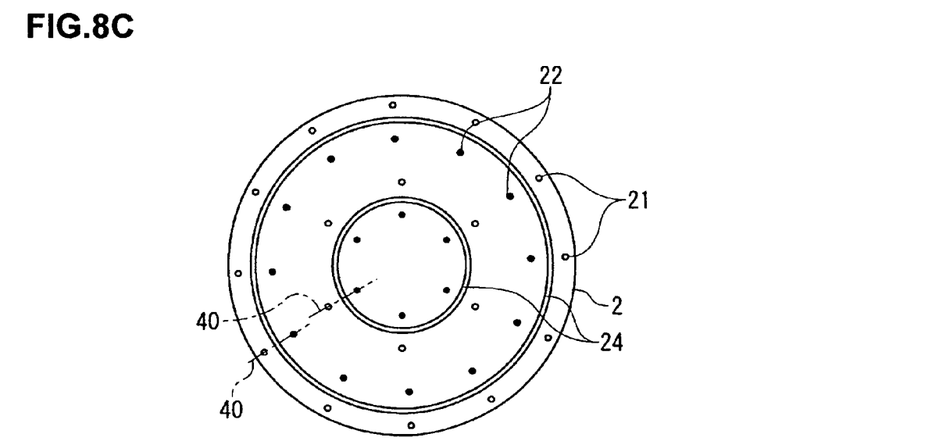
FIG. 8C is an explanatory view showing another example of grooves formed in the mounting table surface.

To guide the cooling air in the circumferential direction as described above, the groove 24 is formed to cross the imaginary straight line linking an air discharge port 21 and an air suction port 22 disposed at the nearest position as seen from the air discharge port 21. For example, the groove 24 may be formed in a spiral shape as shown in FIG. 7A, or the grooves 24 may be formed in square ring shapes as shown in FIG. 7B. Further, the grooves 24 may be vertically and horizontally formed as shown in FIG. 8A, or may be formed in arc shapes as shown in FIG. 8B. Further, the air discharge ports 21, the air suction ports 22, the air discharge ports 21, and the air suction ports 22 are arranged in this order in the circumferential direction from the peripheral edge portion to the center portion of the disk 2, and each of the grooves 24 may be formed to separate the discharge ports 21 and the suction ports 22 as shown in FIG. 8C. Note that the imaginary straight lines are shown by chain lines 40 in the drawings.

(Second Embodiment)

Figure 9:
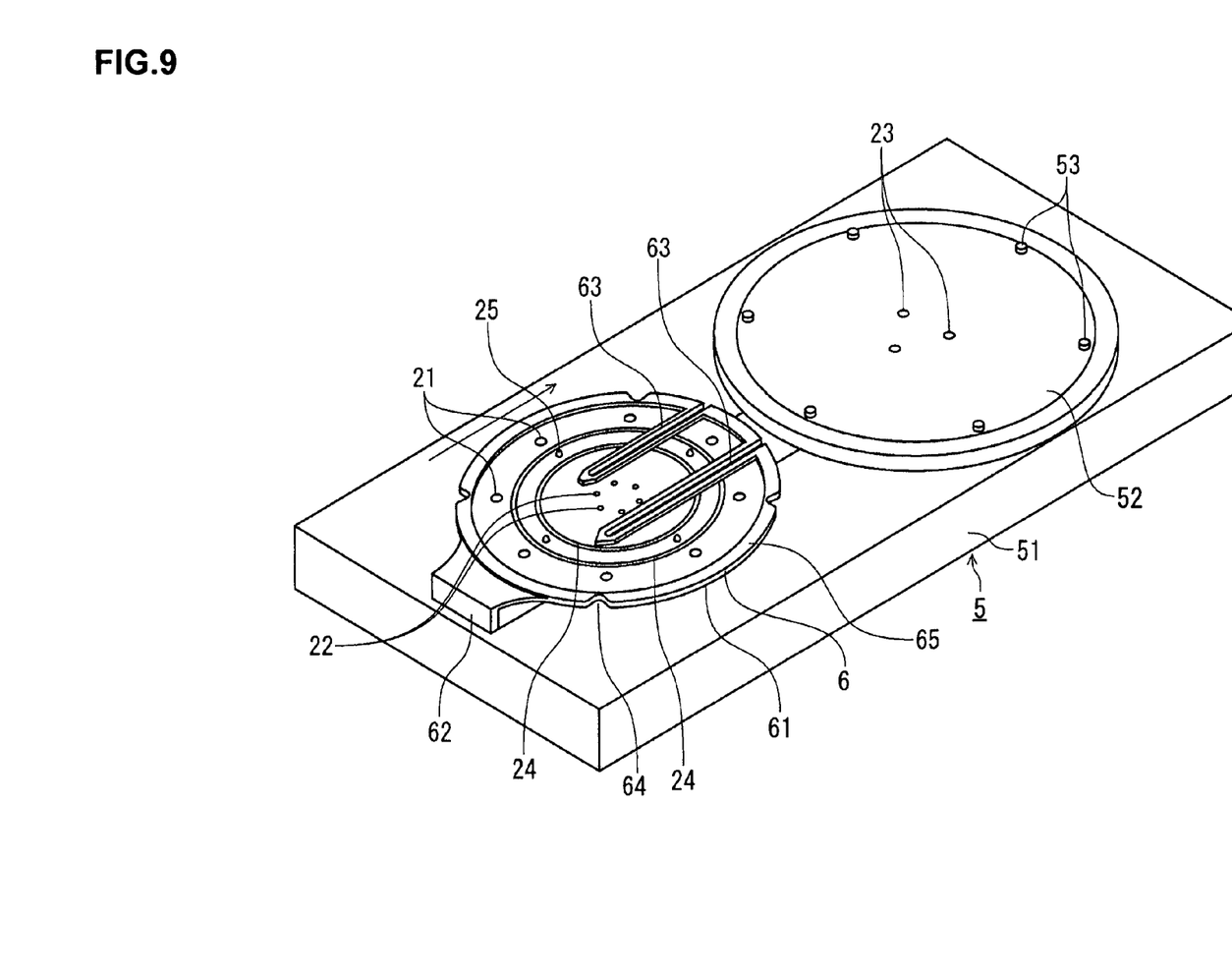
FIG. 9 is a perspective view of a heating apparatus in which the cooling apparatus is installed.

A wafer cooling apparatus installed in a wafer heating apparatus will be described as a second embodiment. FIG. 9 is a perspective view of a wafer heating apparatus 5, and the wafer heating apparatus 5 includes a base 51, a cooling arm 6 provided on the base 51, and a hot plate 52. The hot plate 52 includes a heater therein to heat the wafer W mounted on the hot plate 52 at a predetermined temperature. Further, the hot plate 52 includes holes 23 as in the wafer cooling apparatus 1, and raising and lowering pins 33 project and retract from the hot plate 52 via the holes 23. A numeral 53 in FIG. 9 is a guide pin for preventing side slipping of the wafer W mounted on the hot plate 52.

The cooling arm 6 corresponds to the above-described wafer cooling apparatus 1 and cools the wafer W which has been subjected to heat processing on the hot plate 52. The components commonly provided in the wafer cooling apparatus 1 and the cooling arm 6 are indicated using the same numerals as those used in the wafer cooling apparatus 1 to omit detailed description.

The cooling arm 6 includes a wafer mounting unit 61 which is formed in a substantially circular shape, and a support unit 62 supporting the wafer mounting unit 61 with respect to the base 51. The wafer mounting unit 61 corresponds to the mounting table 11. The support unit 62 moves together with the wafer mounting unit 61 by means of a not-shown moving unit provided at the base 51, and the wafer mounting unit 61 moves between a waiting position shown in FIG. 9 and a delivery position above the hot plate 52. As described above, the cooling arm 6 serves both as a cooling mechanism of the substrate and a transfer mechanism of the substrate.

Figure 10:
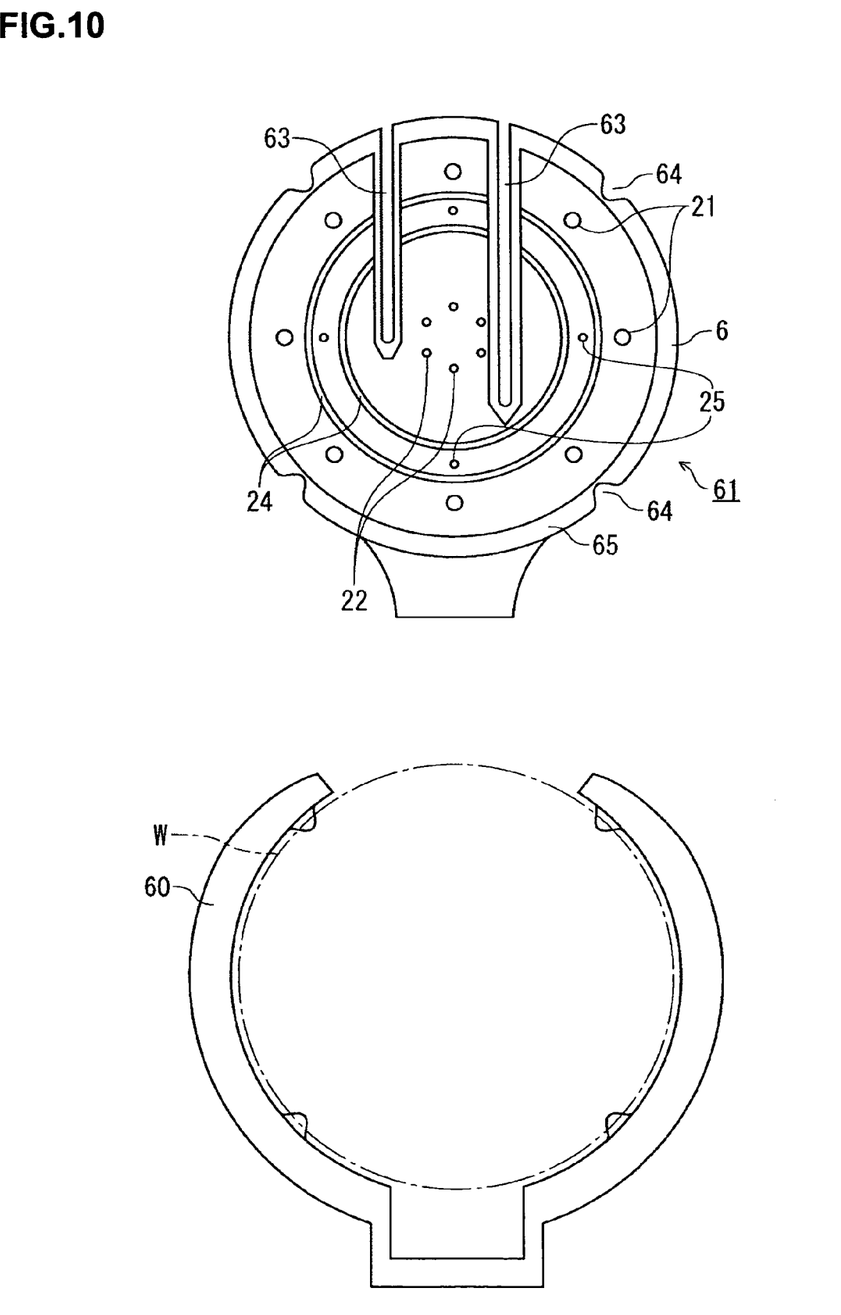
FIG. 10 is a plan view of a cooling arm provided in the heating apparatus.
Figure 11:
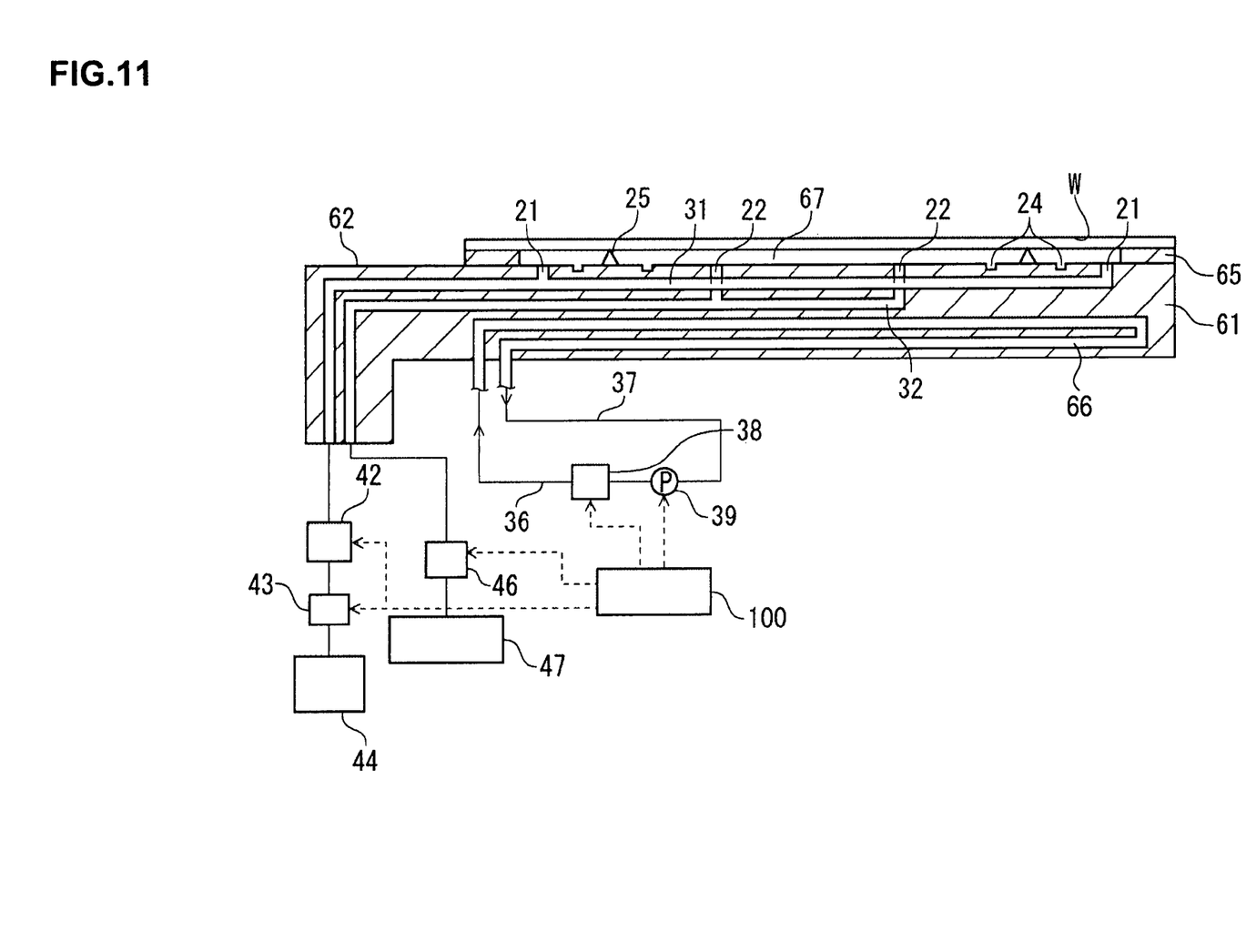
FIG. 11 is a longitudinal side view of the cooling arm.

FIG. 10 and FIG. 11 are a plan view and a longitudinal side view of the cooling arm 6 respectively. As shown in FIG. 10, two cutouts 63 in a slit shape are formed in the wafer mounting unit 61 of the cooling arm 6 from one end of the cooling arm 6 toward the center portion, and the raising and lowering pins 33 project to above the cooling arm 6 via the cutouts 63.

Further, four cutouts 64 are formed in the circumferential direction in the cooling arm 6. The cutouts 64 are formed corresponding to the shape of the transfer unit 60 for delivering the wafer W to/from the transfer unit 60 of the wafer W shown in FIG. 10.

A stepped part 65 bulging upward along the outer shape of the wafer mounting unit 61 is formed on the wafer mounting unit 61, and many air discharge ports 21 are formed inside the stepped part 65 along the circumferential direction of the wafer mounting unit 61. Further, many air suction ports 22 are formed in the circumferential direction at the center portion of the wafer mounting unit 61 as in the wafer cooling apparatus 1. Between the air suction ports 22 and the air discharge ports 21, grooves 24 are formed.

Inside the wafer mounting unit 61, a air supply path 31 and a air suction path 32 are formed which are connected to the air discharge ports 21 and the air suction ports 22 respectively. The air supply path 31 and the air suction path 32 are configured such that the discharge rate of the cooling air from the air discharge ports 21 and the suction rate of the cooling air from the air suction ports 22 are controlled by the control unit 100 as in the wafer cooling apparatus 1. Further, a flow path 66 for the cooling water corresponding to the flow path 35 is formed inside the wafer mounting unit 61, and the flow path 66 and a cooling water supply pipe 36 and a cooling water collecting pipe 37 which are connected to the flow path 66 form a circulation path for the cooling water. The control unit 100 outputs control signals to a water cooling unit 37 and a pump 39 so that the cooling water circulates through the circulation path and the cooling water to be supplied to the flow path 66 is brought to a predetermine temperature. Such circulation of the cooling water cools the surface of the wafer mounting unit 61.

Next, the operation of the wafer heating apparatus 5 will be described. As in the wafer cooling apparatus 1, the suction of air from the air suction ports 22, the temperature control of the cooling water, for example, to 23° C. by a water cooling unit 38, and the circulation of the cooling water through the circulation path are performed in advance. Then, the transfer unit 60 for the wafer W holding the wafer W is located above the cooling arm 6 at the waiting position in FIG. 9 and then lowers.

The wafer W is delivered on the wafer mounting unit 61 while the peripheral edge portion of the wafer W is supported on the stepped part 65 and the support pins 25 as shown in FIG. 11. Thereby, a space 67 surrounded by the surface of the wafer mounting unit 61 and the stepped part 65 becomes a closed space and brought to have a negative pressure by the suction of air from the air suction ports 22, whereby the wafer W is held by suction on the wafer mounting unit 61. The wafer W is temperature-regulated to be close to 23° C. that is the temperature of the mounting unit 61 surface by the heat exchange with the wafer mounting unit 61 surface.

After the transfer unit 60 retracts from the vicinity of the cooling arm 6 and the cooling arm 6 then moves to the delivery position above the hot plate 52, the raising and lowering pins 33 of the hot plate 52 are raised to lift up the wafer W from the wafer mounting unit 61. The cooling arm 6 returns to the waiting position and the raising and lowering pins 33 are lowered to mount the wafer W on the hot plate 52 where the wafer W is heated.

After a lapse of a predetermined time after the wafer W is mounted on the hot plate 52, the raising and lowering pins 33 are raised to lift up the wafer W, and the cooling arm 6 moves to above the hot plate. Then, the raising and lowering pins 33 are lowered, and the wafer W is again held by suction on the wafer mounting unit 61 and cooled. Thereafter, the air cooled, for example, to 20° C. is discharged from the air discharge ports 21. The total flow rate of the air discharged from the air discharge ports 21 is controlled to be smaller than the total flow rate of the air sucked through the suction ports 22. Thereby, the space 67 is continuously kept at the negative pressure, and the wafer W is held by suction on the wafer mounting unit 61.

Then, as in the wafer cooling apparatus 1, the discharged cooling air flows from the peripheral edge portion to the center portion of the wafer mounting unit 61 while being diffused in the circumferential direction of the wafer W by the grooves 24, so that the wafer W is rapidly cooled by the cooling water and the cooling air. The cooling arm 6 moves to the waiting position while cooling the wafer W, and the transfer unit 60 receives the wafer W by the reverse operation to that when delivering the wafer W to the cooling arm 6. Thereafter, the supply of the cooling air is stopped.

Also in the wafer heating apparatus 5, the cooling air can be supplied to the heated wafer W with high uniformity and thereby cool the wafer W with high uniformity. Further, in the wafer heating apparatus 5, the stepped part 65 is provided to prevent ambient air from flowing into the space 67 between the wafer W and the wafer mounting unit 61 during cooling of the wafer W. Accordingly, the force of sucking the wafer W to the wafer mounting unit 61 is increased, so that even when the cooling arm 6 moves at a high speed to deliver the wafer W to the transfer unit 60, it can be prevented that the wafer W slips off from the cooling arm 6 and the cooling arm 6 cannot deliver the wafer W to the transfer unit 60.

Since the air discharge ports 21 and the air suction ports 22 are provided at the peripheral edge portion and the center portion of the wafer mounting unit 61 respectively also in this example, this configuration can prevent the ambient air from flowing into the space between the wafer W and the wafer mounting unit 61. Note that the structure described in the wafer cooling apparatus 1 is also applicable to this wafer heating apparatus 5. For example, as the shape of the grooves 24, those in the examples are applicable, and the temperature sensors 26a to 26c may be provided and the timing of delivering the wafer W to the transfer unit 60 may be controlled according to the detection results. Further, the stepped part 65 may be provided in the wafer cooling apparatus 1 to prevent the displacement of the wafer W.

What is claimed is:
1. A substrate cooling apparatus, comprising:
a mounting table including a mounting surface for mounting a substrate thereon,
temperature sensors embedded in the mounting surface along a radial direction thereof, one temperature sensor configured to detect surface temperature at a center portion of the mounting surface and other temperature sensors configured to detect surface temperatures at peripheral edge portions of the mounting surface;
a plurality of pins extending from the mounting surface for supporting a rear surface of the substrate and configured to form a space having a height from 10 μm to 40 μm between the mounting surface and the rear surface of the substrate;
a cooling gas flow path arranged within the space between the mounting surface and the rear surface of the substrate, the cooling gas flow path having a structure providing a uniform flow of cooling gas on the rear surface of the substrate and uniformly cooling the substrate and preventing variations in temperature within the substrate while cooling the substrate, the cooling gas flow path including:
- a plurality of gas discharge ports for discharging the cooling gas and cooling the substrate, the gas discharge ports provided in one of a circumferential direction at the peripheral edge portion of the mounting surface and the center portion of the mounting surface;
- at least one gas suction port for sucking the cooling gas provided in another one of the peripheral edge portion of the mounting surface and the center portion of the mounting surface, the cooling gas in the cooling gas flow path flowing in one of an inwardly flowing direction and an outwardly flowing direction between the discharge ports and the at least one gas suction port; and
- a plurality of grooves provided in the mounting surface and in the cooling gas flow path, the grooves extending circumferentially and being concentrically arranged between the discharge ports and the at least one gas suction port, the grooves diffusing the flow of the cooling gas from one of the inwardly flow direction and the outwardly flow direction between the discharge ports and the at least one gas suction port and toward the circumferential directions of the grooves, and a control unit being configured to:
- control a supply flow rate of the cooling gas discharged from the gas discharge ports to be smaller than a flow rate of the cooling gas sucked in by the at least one gas suction port,
- control a temperature of the cooling gas discharged from the gas discharge ports to be lower than a cooling target temperature of a substrate mounted on the mounting table,
- supply the cooling gas immediately after the substrate is mounted on the mounting table,
- determine a temperature of the substrate based on detected temperatures from the temperature sensors embedded in the mounting surface, and
- stop the flow of cooling gas when the temperature of the substrate is equal to or less than the cooling target temperature of the substrate.

2. The substrate cooling, apparatus as set forth in claim 1, wherein a plurality of the gas suction ports are provided.

3. The substrate cooling apparatus as set forth in claim 1, wherein the mounting table contains a coolant flow path through which a coolant flows for cooling the mounting surface, and a temperature of the coolant supplied to the coolant flow path is controlled to be lower than a temperature of the cooling gas supplied to the discharge ports.

4. The substrate cooling apparatus as set forth in claim 1, wherein the mounting table forms a part of a substrate transfer mechanism and is configured to be movable by means of a moving unit.

5. The substrate cooling apparatus as set forth in claim 1, wherein the mounting table includes a step bulging upward at the peripheral edge portion of the mounting surface for supporting a peripheral edge portion of the substrate.

6. A substrate cooling method, comprising the steps of:
- mounting a substrate on a mounting surface of a mounting table;
- supporting the substrate by a plurality of pins extending from the mounting surface for supporting a rear surface of the substrate, the pins forming a space having a height from 10 μm to 40 μm between the mounting surface and the rear surface of the substrate;
- cooling the substrate by a flow of cooling gas passing through a cooling gas flow path arranged in the space between the mounting surface and the rear surface of the substrate, the cooling gas uniformly flowing on the rear surface of the substrate, cooling the substrate and preventing variations in temperature within the substrate while cooling the substrate, the flow of cooling gas including:
- discharging the cooling gas from a plurality of gas discharge ports provided in one of a circumferential direction at a peripheral edge portion of the mounting surface and a center portion of the mounting surface;
- sucking the cooling gas through at least one gas suction port provided in another one of the circumferential direction at the peripheral portion of the mounting surface and the center portion of the mounting surface;
- flowing the cooling gas in one of an inwardly flowing direction and an outwardly flowing direction between the discharge ports and the at least one gas suction port
- diffusing the cooling gas from the one of the inwardly flowing direction and the outwardly flowing direction toward circumferential directions of the substrate by a plurality of grooves provided in the mounting surface that are arranged between the discharge ports and the at least one gas suction port and that extend circumferentially;
- controlling a supply flow rate of the cooling gas discharged from gas discharge ports to be smaller than a flow rate of the cooling gas sucked through the at least one gas suction port;
- supplying the cooling gas immediately after a substrate is mounted on the mounting table;
- controlling a temperature of the cooling gas discharged from the gas discharge ports to be lower than a cooling target temperature of the substrate;
- determining a temperature of the substrate using temperature sensors embedded in the mounting surface, one temperature sensor detecting surface temperature at the center portion of the mounting surface, and other temperature sensors detecting surface temperatures at the peripheral edge portions of the mounting surface; and
- stopping the flow of cooling gas when the temperature of the substrate is equal to or less than the cooling target temperature of the substrate.

7. The substrate cooling method as set forth in claim 6, further comprising the step of:
- flowing coolant through a coolant flow path arranged in the mounting table for cooling the mounting surface, and
- controlling a temperature of the coolant supplied to the coolant flow path to be lower than a temperature of the cooling gas supplied to the gas discharge ports.

8. A storage medium storing a computer program used in a substrate cooling apparatus,
wherein the computer program is for implementing a substrate cooling method,
the substrate cooling method comprising the steps of:
- mounting a substrate on a mounting surface of a mounting table;
- supporting the substrate by a plurality of pins extending from the mounting surface for supporting a rear surface of the substrate, the pins forming a space having a height from 10 μm to 40 μm between the mounting surface and the rear surface of the substrate;
- cooling the substrate by a flow of cooling gas passing through a cooling gas flow path arranged in the space between the mounting surface and the rear surface of the substrate, the cooling gas uniformly flowing on the rear surface of the substrate, cooling the substrate and preventing, variations in temperature within the substrate while cooling the substrate;

the flow of cooling gas including:

discharging the cooling gas from gas discharge ports provided in one of a circumferential direction at a peripheral edge portion of the mounting surface and a center portion of the mounting surface;

sucking the cooling gas through gas suction ports provided in another one of the circumferential direction at the peripheral edge portion of the mounting surface and the center portion of the mounting surface,     flowing the cooling gas in a radial direction between the gas discharge ports and the gas suction ports,     diffusing the cooling gas from flowing in the radial direction toward a circumferential direction of the substrate by a plurality of grooves provided in the mounting surface that are concentrically arranged between the discharge ports and the gas suction ports and that extend circumferentially,     controlling a supply flow rate of the cooling gas discharged from the gas discharge ports to be smaller than a flow rate of the cooling gas sucked through the gas suction ports,     supplying the cooling gas immediately after a substrate is mounted on the mounting table,     controlling a temperature of the cooling gas discharged from the gas discharge ports to be lower than a cooling target temperature of the substrate,     determining a temperature of the substrate using temperature sensors embedded in the mounting surface, one temperature sensor detecting surface temperature at the center portion of the mounting surface, and other temperature sensors detecting surface temperatures at the peripheral edge portions of the mounting surface, and     stopping the flow of cooling gas when the temperature of the substrate is equal to or less than the cooling target temperature of the substrate.

\* \* \* \* \*